United States Patent [19]
Mactaggart et al.

[11] Patent Number: 5,748,020
[45] Date of Patent: May 5, 1998

[54] HIGH SPEED CAPTURE LATCH

[75] Inventors: Iain Ross Mactaggart, Eden Prairie; James R. Welch, Maple Grove, both of Minn.; Alan Fiedler, Palo Alto, Calif.

[73] Assignee: LSI Logic Corporation, Milpitas, Calif.

[21] Appl. No.: 595,821

[22] Filed: Feb. 2, 1996

[51] Int. Cl.$^6$ .................................................. H03K 19/096
[52] U.S. Cl. ........................... 327/218; 327/208; 327/211; 327/215; 327/55; 327/52; 327/57
[58] Field of Search .................................. 327/199–203, 327/208–215, 218, 219, 223, 51, 52, 54, 55, 57; 365/205, 207, 189.05

[56] References Cited

U.S. PATENT DOCUMENTS

| | | | |
|---|---|---|---|
| 4,712,224 | 12/1987 | Nelson | 377/43 |
| 4,821,296 | 4/1989 | Cordell | 375/119 |
| 4,973,864 | 11/1990 | Nogami | 327/52 |
| 5,081,655 | 1/1992 | Long | 375/119 |
| 5,115,455 | 5/1992 | Samaras et al. | 375/106 |
| 5,148,061 | 9/1992 | Hsueh et al. | 327/211 |
| 5,162,746 | 11/1992 | Ghoshal | 328/155 |
| 5,200,980 | 4/1993 | Briddell | 375/83 |
| 5,272,395 | 12/1993 | Vincelette | 307/355 |
| 5,278,873 | 1/1994 | Lowrey et al. | 375/118 |
| 5,280,205 | 1/1994 | Green et al. | 307/530 |
| 5,301,196 | 4/1994 | Ewen et al. | 370/105.2 |
| 5,361,229 | 11/1994 | Chiang et al. | 365/189.05 |
| 5,371,766 | 12/1994 | Gersbach et al. | 375/119 |
| 5,400,370 | 3/1995 | Guo | 375/118 |
| 5,508,643 | 4/1996 | Khieu | 327/52 |
| 5,508,644 | 4/1996 | Branson et al. | 327/51 |

OTHER PUBLICATIONS

"A 30 MHz High Speed Analog/Digital PLL in 2 μm CMOS," B. Kim et al., IEEE International Solid–State Circuits Convention, Digest of Technical Papers, pp. 104–105 (1990).

"Single Chip 1062 Mbaud CMOS Transceiver for Serial Data Communication," J. Ewen et al., IEEE International Solid–State Circuits Conference, Digest of Technical Papers, pp. 18–19, 32–33, 336, 440 (1995).

Primary Examiner—Timothy P. Callahan
Assistant Examiner—T. T. Lam
Attorney, Agent, or Firm—Westman, Champlin & Kelly, P.A.

[57] ABSTRACT

A high speed capture latch includes differential data inputs, a latch clock input, a boost clock input, a current steering circuit, a switched current source, a latch element and first and second boost current sources. The current steering circuit has first and second differential control terminals which are coupled to the differential data inputs and control current through first and second current paths, respectively. The switched current source is coupled between the current steering circuit and a first voltage supply terminal and has a control terminal coupled to the latch clock input. The latch element is coupled between a second voltage supply terminal and the current steering circuit and provides a latch output. The first boost current source is coupled to the first current path between the latch element and the current steering circuit and has a control terminal coupled to the boost clock input. The second boost current source is coupled to the second current path between the latch element and the current steering circuit and has a control terminal coupled to the boost clock input.

17 Claims, 2 Drawing Sheets

5,748,020

1

HIGH SPEED CAPTURE LATCH

CROSS REFERENCE TO RELATED APPLICATION

Cross reference is hereby made to U.S. patent application of Welch et al., entitled "Self-Timed Phase Detector And Method," and to U.S. patent application of Fiedler et al., entitled "System And Method For High Speed Capture Of A Serial Data Stream," which were filed on even date herewith.

BACKGROUND OF THE INVENTION

The present invention relates to a capture latch, and more particularly, to a differential capture latch having boost transistors and precharged outputs.

Capture latches or flip-flops are used in integrated circuits, such as application specific integrated circuits (ASICs), for clock and data recovery of high speed serial data streams. Serial data streams pass data at a very high rate from one integrated circuit to the next. Because of variations in the fabrication process, operating temperature, power supply levels, interconnects and routings, individual clock delays may be different from one integrated circuit to the next. These differences may create a clock skew between each integrated circuit and a system clock.

Initially, a local on-chip clock may be faster or slower than the system clock and probably out of phase. To minimize clock skew and achieve synchronization, a phase locked loop, for example, is used to track the system clock, compare it with the local clock, detect any phase or frequency difference and then make any necessary adjustments to the local clock until the on-chip clock matches the system clock. The phase locked loop has then "locked-on" to the system clock. Once every integrated circuit in the system is synchronized with the system clock, the entire system works in unison.

In data recovery applications, the phase locked loop locks on to the phase and frequency of the data transitions in the serial data stream. The local clock is then used to clock a single capture latch having an input coupled to the serial data stream. A typical capture latch has low resolution and a poor aperture, which severely limit the rate at which the clock or data can be recovered. Higher performance capture latches require complex circuitry and clocking, which consume a large amount of area on the integrated circuit and a large amount of power.

SUMMARY OF THE INVENTION

The high speed capture latch of the present invention has a simple architecture, low power consumption and high resolution. The latch includes differential data inputs, a latch clock input, a boost clock input, a current steering circuit, a switched current source, a latch element and first and second boost current sources. The current steering circuit has first and second differential control terminals which are coupled to the differential data inputs and control current through first and second current paths, respectively. The switched current source is coupled between the current steering circuit and a first voltage supply terminal and has a control terminal coupled to the latch clock input. The latch element is coupled between a second voltage supply terminal and the current steering circuit and provides a latch output. The first boost current source is coupled to the first current path between the latch element and the current steering circuit and has a control terminal coupled to the boost clock input.

2

The second boost current source is coupled to the second current path between the latch element and the current steering circuit and has a control terminal coupled to the boost clock input.

A latch clock signal applied to the latch clock input initiates an evaluation of the differential data inputs. A period of time after the latch element begins to resolve the latch output, a boost clock signal applied to the boost clock input activates the boost current sources. The boost current sources speed the latch output resolution by providing additional current to the latch element and also isolate the differential data inputs from the latch output. The boost current sources thus speed the latch and precisely define the latch aperture.

In one embodiment, the latch includes first and second complementary latch outputs and first and second precharge circuits which are coupled to the first and second complementary latch outputs, respectively. The precharge circuits have control terminals which are coupled to the latch clock input. The precharge circuits are active on an opposite logic state of the latch clock signal than the switched current source, which activates the latch element. When the latch clock signal is inactive, the precharge circuits precharge the latch outputs to a selected logic state. When the latch clock signal is active, the precharge circuits become inactive and the latch outputs tend toward complementary logic states in response to data applied to the differential data inputs.

DETAILED DESCRIPTION OF THE PREFERRED EMBODIMENTS

Figure 1:
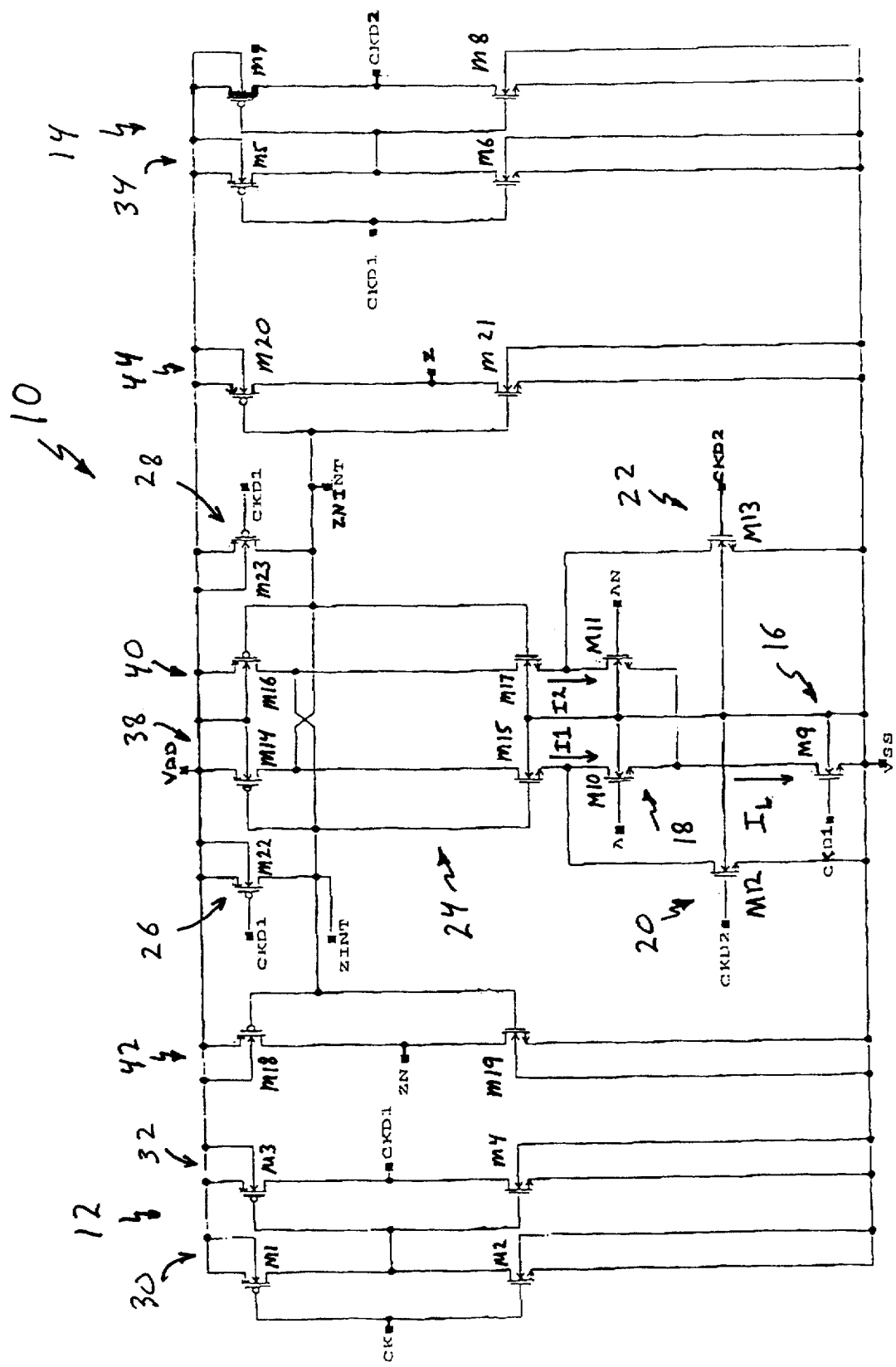
FIG. 1 is a schematic diagram of a capture latch in accordance with the present invention.

FIG. 1 is a schematic diagram of a high speed capture latch having boost current sources and precharge circuits in accordance with the present invention. Capture latch 10 is coupled between voltage supply terminals VDD and VSS. Latch 10 includes differential latch inputs A and AN, clock input CK and external latch outputs Z and ZN. Latch 10 further includes slew rate delay circuit 12, boost delay circuit 14, switched current source 16, current steering circuit 18, boost current sources 20 and 22, latch element 24 and precharge circuits 26 and 28.

Slew rate delay circuit 12 is coupled between clock input CK and clock node CKD1. Slew rate delay circuit 12 includes CMOS inverters 30 and 32 which are connected in series with one another to form a buffer. Inverter 30 includes PMOS transistor M1 and NMOS transistor M2. The source of transistor M1 is coupled to voltage supply terminal VDD. The gate of transistor M1 is coupled to clock input CK and the gate of transistor M2. The drain of transistor M1 is coupled to the drain of transistor of M2. The source of transistor M2 is coupled to voltage supply terminal VSS. Inverter 32 includes PMOS transistor M3 and NMOS transistor M4. The source of transistor M3 is coupled to voltage supply terminal VDD. The gate of transistor M3 is coupled to the gate of transistor M4 and to the drains of transistors of M1 and M2. The source of transistor M4 is coupled to voltage supply terminal VSS. Slew rate delay circuit 12 receives a sample clock signal on clock input CK and generates a delayed latch clock signal with precisely defined rise and fall characteristics on clock node CKD1.

Boost delay circuit 14 includes CMOS inverters 34 and 36. Boost delay circuit 14 has an input coupled to clock node CKD1 and an output coupled to clock node CKD2. Inverter 34 includes PMOS transistor M5 and NMOS transistor M6. The source of transistor M5 is coupled to voltage supply terminal VDD. The gate of transistor M5 is coupled to the gate of transistor M6 and clock node CKD1. The drain of transistor M5 is coupled to the drain of transistor M6. The source of transistor M6 is coupled to voltage supply terminal VSS. Inverter 36 includes PMOS transistor M7 and NMOS transistor M8. The source of transistor M7 is coupled to voltage supply terminal VDD. The gate of transistor M7 is coupled to the gate of transistor M8 and to the drains of transistors M5 and M6. The source of transistor M8 is coupled to voltage supply terminal VSS. Boost delay circuit 14 receives the latch clock signal on clock node CKD1 and generates a delayed boost clock signal on clock node CKD2.

Switched current source 16 includes NMOS transistor M9. The drain of transistor M9 is coupled to current steering circuit 18. The gate of transistor M9 is coupled to clock node CKD1. The source of transistor M9 is coupled to voltage supply terminal VSS. Transistor M9 provides a latch current $I_L$ to current steering circuit 18 on the active edge of the latch clock signal generated on clock node CKD1.

Current steering circuit 18 includes a differential transistor pair formed by NMOS transistors M10 and M11. The drains of transistors M10 and M11 form first and second current paths I1 and I2, respectively. The gate of transistor M10 is coupled to latch input A. The gate of transistors M11 is coupled to latch input AN. The sources of transistors M10 and M11 are connected to one another and to the drain of transistor M9. Transistors M10 and M11 steer latch current $I_L$ into current paths I1 and I2 according to the relative polarity of the input signals applied to latch inputs A and AN. The latch input signals can be differential analog signals or complementary digital signals, for example. The term "differential", used in the specification and in the claims includes differential analog signals and complementary digital signals.

Boost current source 20 includes NMOS transistor M12 which has a drain coupled to the drain of transistor M10, a gate coupled to clock node CKD2 and a source coupled to voltage supply terminal VSS. Boost current source 22 includes NMOS transistor M13 which has a drain coupled to the drain of transistor M11, a gate coupled to delay clock node CKD2 and a source coupled to voltage supply terminal VSS. Boost current sources 20 and 22 provide additional current to latch element 24 and isolate latch element 24 from latch inputs A and AN by coupling the drains of transistors M10 and M11 to voltage supply terminal VSS after a time delay. The time delay is determined by boost delay circuit 14 and is the difference between an active edge of the latch clock signal on clock node CKD1 and an active edge of the boost clock signal on clock node CKD2. In a preferred embodiment, boost transistors M12 and M13 have a low output impedance.

Latch element 24 includes a pair of cross coupled CMOS inverters 38 and 40. Inverter 38 includes PMOS transistor M14 and NMOS transistor M15. The source of transistor M14 is coupled to voltage supply terminal VDD. The gate of transistor M14 is coupled to the gate of transistor M15 and to internal latch output node ZINT. The drain of transistor M14 is coupled to the drain of transistor M15. The source of transistor M15 is coupled to the drain of transistor M10 and the drain of transistor M12. Inverter 40 includes PMOS transistor M16 and NMOS transistor M17. The source of transistor M16 is coupled to voltage supply terminal VDD. The gate of transistor M16 is coupled to the gate of transistor M17, the drains of transistors M14 and M15 and internal latch output node ZNINT. The drain of transistor M16 is coupled to the drain of transistor M17, the gates of transistors M14 and MiS and internal latch output node ZNINT.

Precharge circuits 26 and 28 include PMOS precharge transistors M22 and M23, respectively. The source of transistor M22 is coupled to voltage supply terminal VDD. The gate of transistor M22 is coupled to clock node CKD1. The drain of transistor M22 is coupled to internal latch output node ZINT. The source of transistor M23 is coupled to voltage supply terminal VDD. The gate of transistor M23 is coupled to clock node CKD1. The drain of transistor M23 is coupled to internal latch output node ZNINT. Since precharged transistors M22 and M23 are PMOS devices and transistor M9 of current source 16 is a NMOS device, precharged transistors M22 and M23 are out of phase with transistor M9 with respect to the latch clock signal.

Latch 10 further includes CMOS output inverters 42 and 44. Output inverter 42 has an input coupled to internal latch output node ZINT at an output coupled to external latch output node ZN. Output inverter 42 includes PMOS transistor M18 and NMOS transistor M19. The source of transistor M18 is coupled to voltage supply terminal VDD. The gate of transistor M18 is coupled to the gate of transistor M19 and to internal latch output node ZINT. The drain of transistor M18 is coupled to the drain of transistor M19 and to external latch output node ZN. The source of transistor M19 is coupled to voltage supply terminal VSS.

Output inverter 44 has an input coupled to internal latch output node ZNINT and an output coupled to external latch output node Z. Output inverter 44 includes PMOS transistor M20 at NMOS transistor M21. The source of transistor M20 is coupled to voltage supply terminal VDD. The gate of transistor M20 is coupled to the gate of transistor M21 and to internal latch output node ZNINT. The drain of transistor M20 is connected to the drain of transistor M21 and to external latch output node Z. The source of transistor M21 is coupled to voltage supply terminal VSS. Since cross coupled inverters 38 and 40 are coupled to nodes ZINT and ZNINT, the inverters are somewhat sensitive to voltage levels on nodes ZINT and ZNINT. Output inverters 42 and 44 serve to isolate nodes ZINT and ZNINT from latch output nodes Z and ZN.

During operation, when the latch clock signal on clock node CKD1 is inactive, precharge transistors M22 and M23 are on and pull internal latch output nodes ZINT and ZNINT to a logic HIGH level, which are inverted by output inverters 42 and 44. External latch output nodes Z and ZN are thus "precharged" to a logic LOW level.

When the latch clock signal becomes active, precharge transistors M22 and M23 turn off and transistor M9 of current source 16 turns on, which initiates an evaluation of the input signals applied to latch inputs A and AN. For example, if the signal on latch input A is greater than the signal on latch input AN, most of latch current $I_L$ flows through transistor M10 and current path I1. Transistor M10 supplies current to transistor M15, which unbalances cross coupled inverters 38 and 40 such that latch element 24 tips in one direction.

Transistor M15 begins to turn on which causes drain of transistor M15, and thus the gate of transistor M16 to fall LOW. Transistor M16 turns on which reinforces transistor M15 by pulling the drain of transistor M16, and thus the gate of transistor M15, HIGH. Since the drain of transistor M16 is HIGH, the gate of transistor M14 is HIGH, which turns off transistor M14. With the drain of transistor M15 LOW, the gate of transistor M17 is LOW, which turns off transistor M17. With transistors M14 and M17 off and transistors M15 and M16 on, internal latch output nodes ZINT and ZNINT tend toward complementary logic states of HIGH and LOW, respectively.

After the time delay determined by boost delay circuit 14, the boost clock signal generated on clock node CKD2 becomes active, which turns on boost transistors M12 and M13. Transistors M12 and M13 pull the drains of transistors M10 and M11 LOW which isolate latch element 24 from latch inputs A and AN. Any change in the relative polarity of the signals applied to latch inputs A and AN no longer have an effect on the balance of latch element 24. Boost transistors M12 and M13 also speed the separation of cross coupled inverters 38 and 40 by providing additional current to inverters 38 and 40. The additional current speeds the resolution of latch output nodes Z and ZN.

The high speed capture latch of the present invention has a precisely defined aperture. The latch aperture is defined as the time during which the state of latch element 24 is affected by the input signals applied to latch inputs A and AN. The latch aperture is thus limited to the time between the active edge of CKD1 and the active edge of CKD2, which can be precisely defined by defining the delay through boost delay circuit 18.

Without the CMOS buffer between CK and CKD1 within slew rate delay circuit 12, the delay through boost delay circuit 18 would be dependent on the rise and fall characteristics of the sample clock applied to clock input CK. If CKD1 has a long rise time, the delay between CKD1 and CKD2 will be short. If CKD1 has a short rise time, the delay between CKD1 and CKD2 will be long. Slew rate delay circuit 12 precisely defines the rise and fall times of CKD1 and therefore allows for accurate control of the delay between CKD1 and CKD2.

Slew rate delay circuit 12 and boost delay circuit 14 are asynchronous delay circuits. Although the delay circuits are implemented with CMOS inverters, any asynchronous or synchronous delay circuit can be used with the present invention. An example of a synchronous delay circuit which is implemented with a voltage controlled oscillator is shown in FIG. 2.

Figure 2:
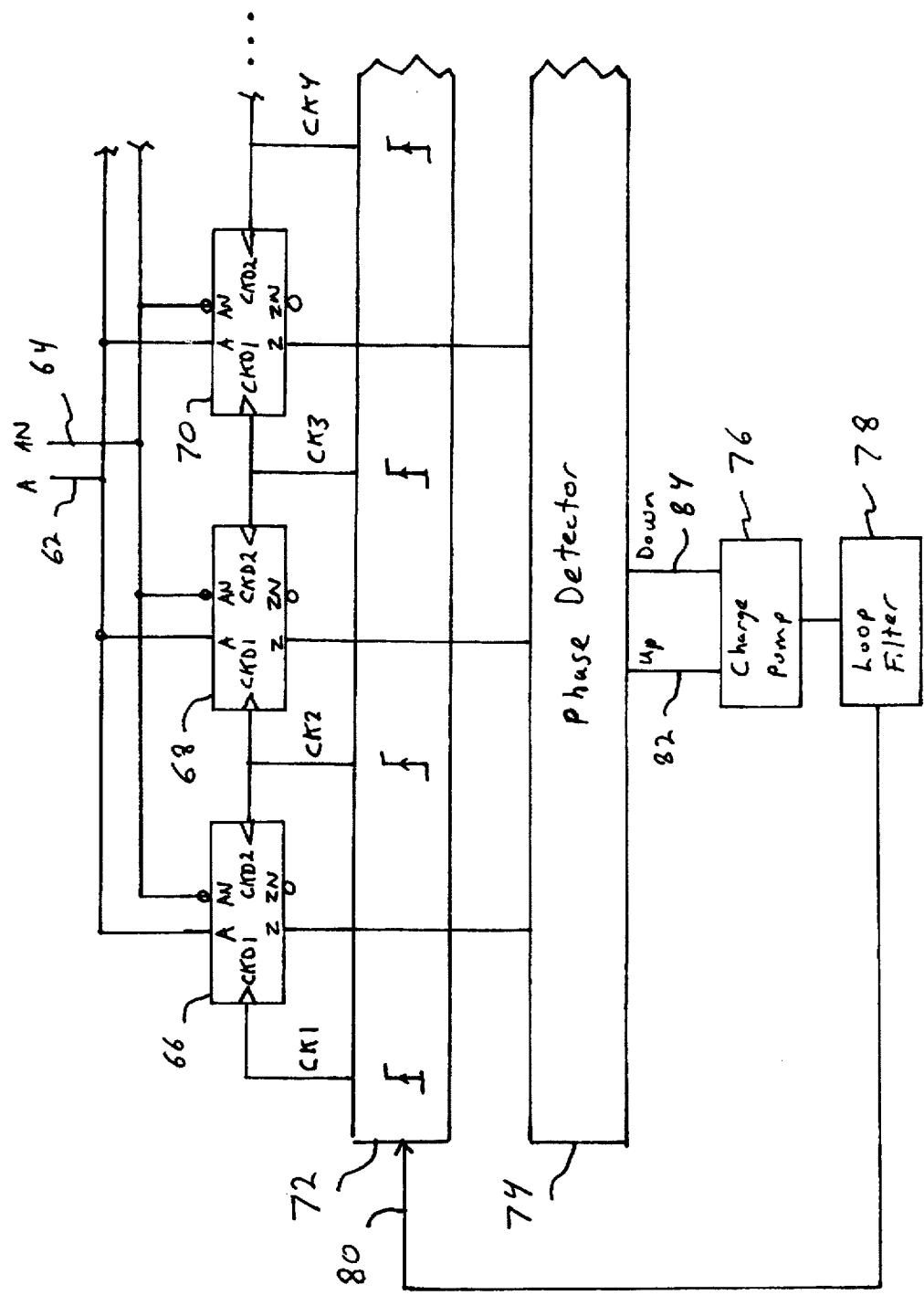
FIG. 2 is a schematic diagram of a capture latch coupled in a phase locked loop in accordance with the present invention.
Figure 1:
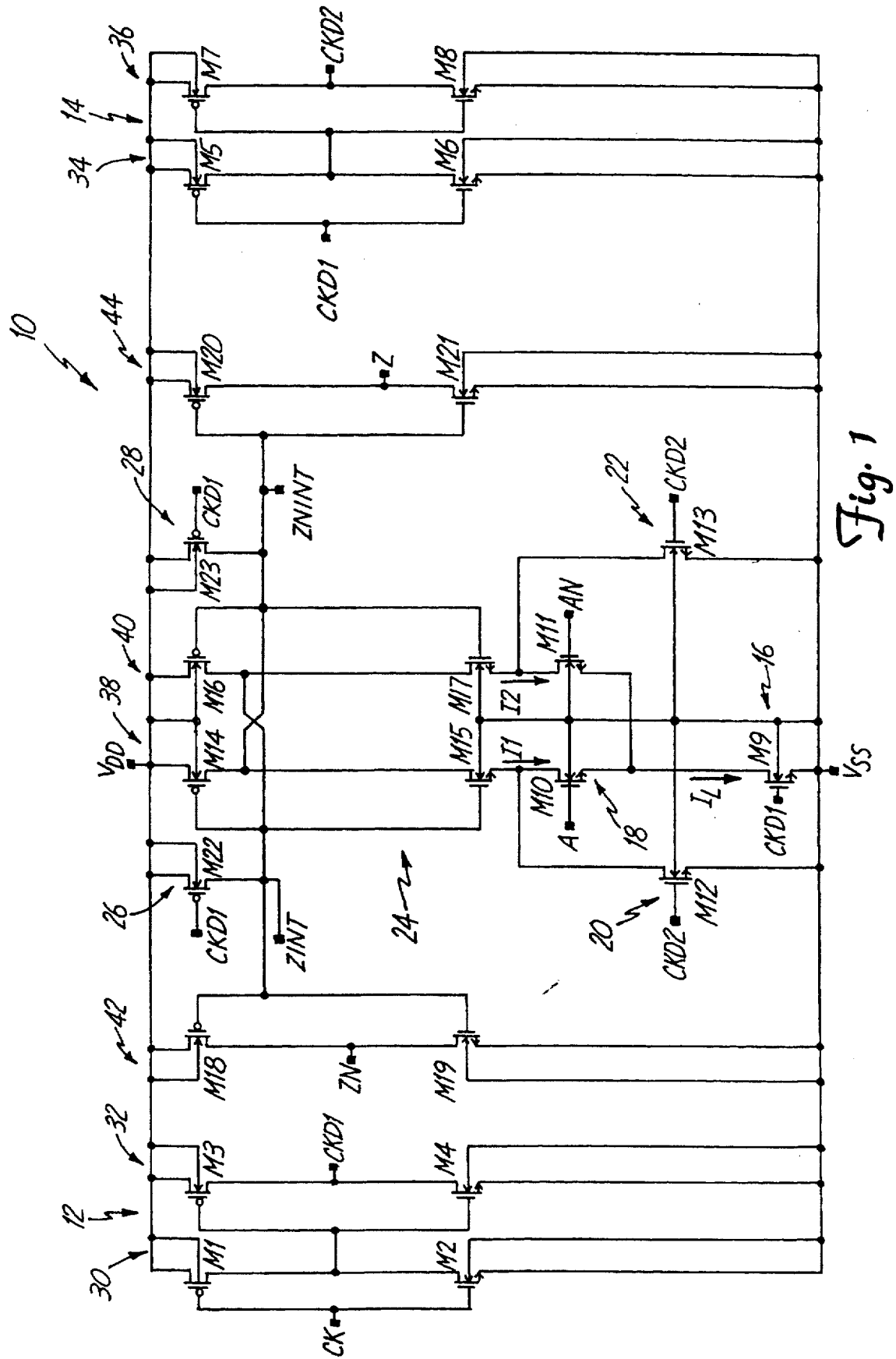
Figure 2:
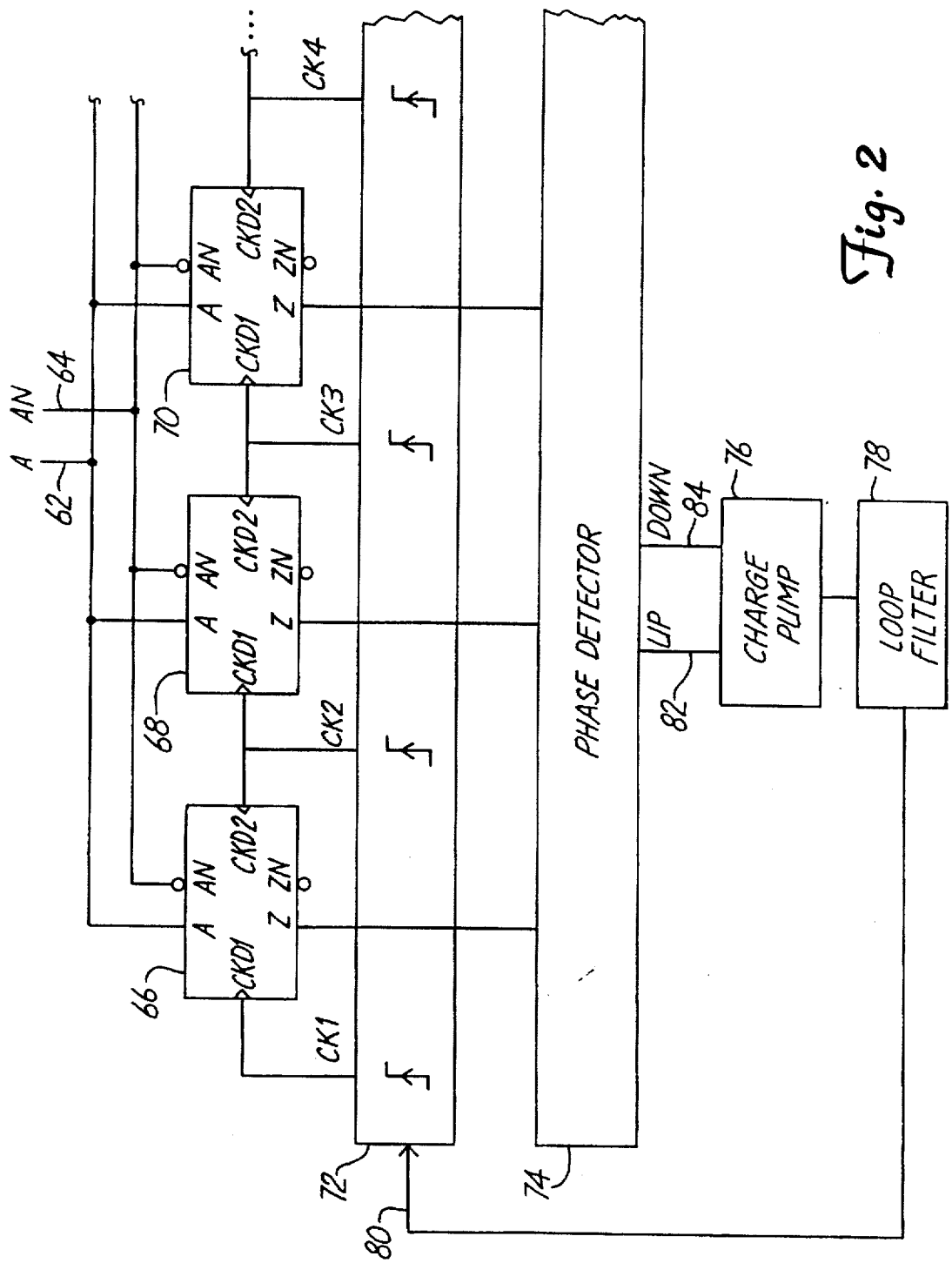

FIG. 2 is a block diagram of a phase locked loop which has a high speed capture latch and a voltage controlled oscillator in accordance with the present invention. Phase locked loop 60 locks onto a phase and frequency of a serial data stream applied to inputs 62 and 64. Phase locked loop 60 includes a plurality of capture latches 66, 68 and 70, voltage controlled oscillator (VCO) 72, phase detector 74, charge pump 76 and loop filter 78.

Capture latches 66, 68 and 70 include latch inputs A and AN which are coupled to inputs 62 and 64 for sampling the serial data stream that is applied to inputs 62 and 64. Capture latches 66, 68 and 70 further include latch clock input CKD1, boost clock input CKD2 and complementary latch outputs Z and ZN. Capture latches 66, 68 and 70 are similar to the latch shown in FIG. 1, but do not include slew rate delay circuit 12 and boost delay circuit 14. Rather, clock node CKD1 and CKD2 are coupled directly to VCO 72.

VCO 72 is a multi-stage VCO which generates a plurality of sample clock signals CK1–CK4, with each sample clock signal being delayed or shifted slightly from the previous sample clock signal. Sample clock signal CK1 is coupled to latch clock input CKD1 of latch 66. Sample clock signal CK2 is coupled to boost clock input CKD2 of latch 66 and to latch clock input CKD1 of latch 68. Sample clock signal CK3 is coupled to boost clock input CKD2 of latch 68 and latch clock input CKD1 of latch 70. Sample clock signal CK4 is coupled to boost clock input CKD2 of latch 70. Each boost clock input CKD2 is slightly delayed from the corresponding latch clock input CKD1. The length of the delay sets an upper limit on the latch aperture and is controlled by controlling the phase and frequency of the sample clocks as a function of the voltage applied to voltage input 80 of VCO 72.

Phase detector 74 looks for transitions in the inputs data stream and adjusts the phase and frequency of VCO 72 to match the phase and frequency of the transitions. Phase detector 74 generates phase signals on phase outputs 82 and 84 which are representative of a difference between the phase and frequency of the input data stream and the phase and frequency of sample clock signals CK1–CK4. When the sample clocks lag the data transitions, phase detector 74 places a logic HIGH level on phase output 82 (labeled "up") to indicate that the sample clocks should be advanced. When the sample clocks lead the data transitions, phase detector 74 places a logic HIGH signal on phase output 84 (labeled "down") to indicate that the sample clocks should be delayed.

Charge pump 76 is coupled to phase outputs 82 and 84. Charge pump 76 incrementally increases, decreases or maintains a voltage across loop filter 78 as a function of the phase signals. The output of loop filter 78 is coupled to voltage input 80 of VCO 72, and thus adjusts the phase and frequency of the sample clock signals clocks in accordance with the phase signals. The operation of phase locked loop 60 and phase detector 74 are described in greater detail in co-pending U.S. patent applications of Fiedler et al., entitled "System And Method For High Speed Capture Of A Serial Data Stream," and Welch et al., entitled "Self-Timed Phase Detector And Method," which were filed on even date herewith and are hereby incorporated by reference.

The high speed capture latch of the present invention provides low power, high resolution capture of rapidly changing data. The high resolution and precisely defined aperture make the latch particularly useful for capturing data from very high speed serial data streams. However, the latch can be used in a variety of applications. The latch has a lower complexity than latches of the prior art that offer similar or even poorer performance. This results in a smaller number of components and a smaller area being required to implement the latch. The latch also consumes less power.

Although the present invention has been described with reference to preferred embodiments, workers skilled in the art will recognize that changes may be made in form and detail without departing from the spirit and scope of the invention. For example, the latch can be implemented with a variety of components and in a variety of configurations. The latch can be implemented with discreet components, with semiconductor devices embedded in an integrated circuit, such as an application specific integrated circuit (ASIC), or with a combination of both. The latch can also be used as the master latch portion of a D-type flip-flop. The circuit configurations shown herein are provided as examples only.

Individual signals or devices can be active HIGH or LOW, and corresponding circuitry can be converted or complemented to suit a particular convention. For example, pre-charge transistors M22 and M23 (shown in FIG. 1) can be replaced with NMOS transistors coupled to voltage supply terminal VSS as opposed to voltage supply terminal VDD. Transistor M9 of current source 16 would then be replaced with a PMOS transistor so that transistor M9 would remain out of phase with precharge transistors M22 and M23. The term "coupled" used in the specification and in the claims includes various types of connections or couplings and includes a direct connection or a connection through one or more intermediate components.

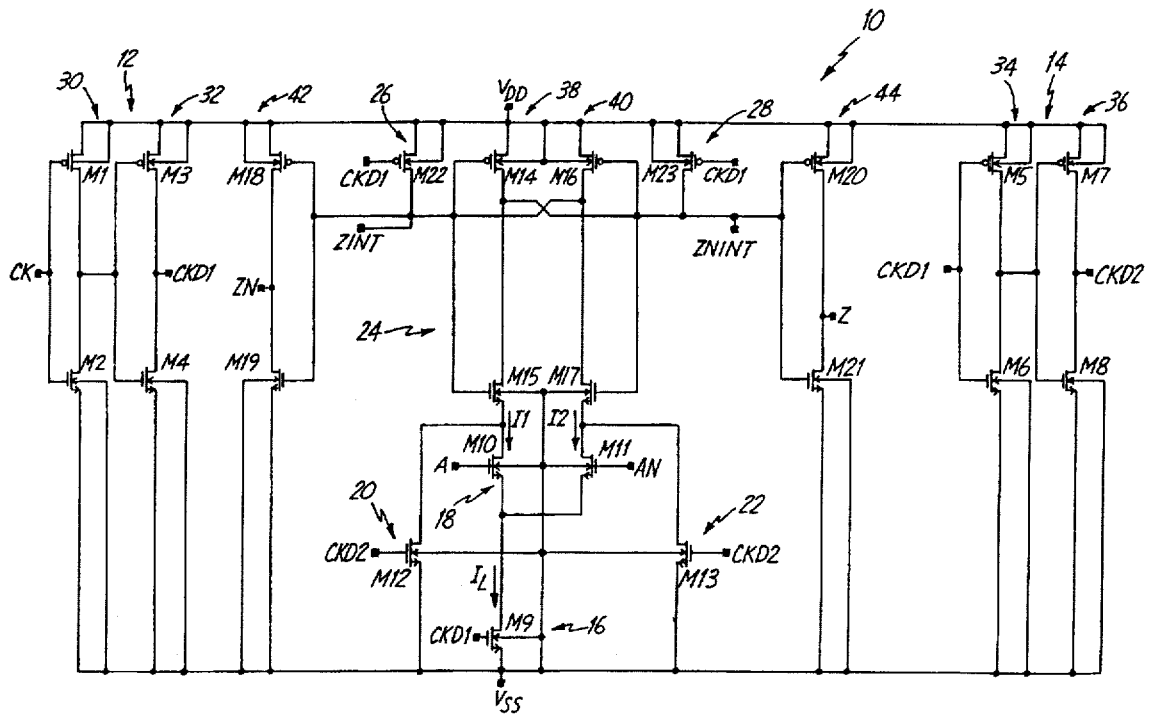

What is claimed is:

1. A latch comprising:
   a latch clock input;
   a boost clock input;
   first and second voltage supply terminals;
   a current steering circuit having first and second differential control terminals which control current through first and second current paths;
   a switched current source coupled between the current steering circuit and the first voltage supply terminal and having a control terminal coupled to the latch clock input;
   a latch element coupled between the second voltage supply terminal and the current steering circuit and having a latch output;
   a first boost current source coupled to the first current path between the latch element and the current steering circuit and having a control terminal coupled to the boost clock input; and
   a second boost current source coupled to the second current path between the latch element and the current steering circuit and having a control terminal coupled to the boost clock input.

2. The latch of claim 1 and further comprising a sample clock input and a slew rate delay circuit coupled between the sample clock input and the latch clock input.

3. The latch of claim 1 and further comprising a boost delay circuit coupled between the latch clock input and boost clock input.

4. The latch of claim 1 and further comprising a multi-stage voltage controlled oscillator (VCO) having a control voltage input, a first clock output coupled to the latch clock input, and a second clock output coupled to the boost clock input, wherein the second clock output is delayed from the first clock output.

5. The latch of claim 1 wherein the current steering circuit comprises a differential transistor pair.

6. The latch of claim 5 wherein the differential transistor pair comprises:
   a first transistor having first and second terminals coupled in series with the first current path and a control terminal which forms the first differential control terminal;
   a second transistor having first and second terminals coupled in series with the second current path and a control terminal which forms the second differential control terminal;
   wherein the first terminals of the first and second transistors are coupled to the latch element and the second terminals of the first and second transistors are coupled to one another and to the switched current source; and
   wherein the first boost current source is coupled between the first terminal of the first transistor and the first voltage supply terminal and the second boost current source is coupled between the first terminal of the second transistor and the first voltage supply terminal.

7. The latch of claim 1 wherein the switched current source comprises a transistor having a first terminal coupled to the current steering circuit, a second terminal coupled to the first voltage supply terminal and a control terminal which forms the control terminal of the switched current source.

8. The latch of claim 1 wherein the latch element comprises a pair of cross coupled inverters.

9. The latch of claim 8 wherein the latch element comprises:
   first and second complementary latch outputs;
   a first CMOS inverter comprising:
      a first transistor having a first terminal coupled to the second voltage supply terminal, a second terminal, and a control terminal coupled to the first complementary latch output; and
      a second transistor having a first terminal coupled to the second terminal of the first transistor, a second terminal coupled to the first current path of the current steering circuit, and a control terminal coupled to the first complementary latch output; and
   a second CMOS inverter comprising:
      a third transistor having a first terminal coupled to the second voltage supply terminal, a second terminal coupled to the control terminals of the first and second transistors, and a control terminal coupled to the second complementary latch output, the second terminal of the first transistor and the first terminal of the second transistor; and
      a fourth transistor having a first terminal coupled to the second terminal of the third transistor, a second terminal coupled to the second current path of the current steering circuit, and a control terminal coupled to the second complementary latch output.

10. The latch of claim 1 wherein:
    the first boost current source comprises a first boost transistor having a first terminal coupled to the first current path, a second terminal coupled to the first voltage supply terminal, and a control terminal which forms the control terminal of the first boost current source; and
    the second boost current source comprises a second boost transistor having a first terminal coupled to the second current path, a second terminal coupled to the first voltage supply terminal, and a control terminal which forms the control terminal of the second boost current source.

11. The latch of claim 10 wherein the first and second boost transistors comprise low output impedance MOS transistors.

12. The latch of claim 10 wherein the current steering circuit comprises:
    a first transistor having a first terminal coupled to the first terminal of the first boost transistor and to the latch element, a second terminal coupled to the switched current source, and a control terminal which forms the first differential control terminal; and
    a second transistor having a first terminal coupled to the first terminal of the second boost transistor and to the latch element, a second terminal coupled to the switched current source, and a control terminal which forms the second differential control terminal.

13. The latch of claim 1 wherein the latch output comprises first and second complementary latch outputs and wherein the latch further comprises:
    a first precharge transistor having a first terminal coupled to the second voltage supply terminal, a second terminal coupled to the first complementary latch output, and a control terminal coupled to the latch clock input; and a second precharge transistor having a first terminal coupled to the second voltage supply terminal, a second terminal coupled to the second complementary latch output, and a control terminal coupled to the latch clock input.

14. The latch of claim 1 and further comprising CMOS inverter coupled to the latch output.

15. A latch for sampling a data signal, comprising:

first and second data inputs for receiving the data signal;

a latch clock input for receiving a latch clock signal;

a boost clock input for receiving a boost clock signal;

steering means coupled to the first and second data inputs for steering current through first and second current paths as a function of the data signal;

current source means coupled to the steering means and to the latch clock input for supplying a current to the first and second current paths as a function of the latch clock signal;

latch means coupled to the steering means for generating a latched data output as a function of the current through the first and second current paths; and boost current means coupled to the first and second current paths, between the latch means and the steering means, and coupled to the boost clock input for supplying a boost current to the first and second current paths as a function of the boost clock signal.

16. A precharged latch comprising:

first and second voltage supply terminals;

a latch clock input for receiving a latch clock signal having first and second logic states;

a boost clock input for receiving a boost clock signal having first and second logic states;

a latch circuit coupled to the latch clock input and between the first and second voltage supply terminals, wherein the latch circuit comprises a latch input and first and second complementary latch outputs within first and second current paths, respectively, and wherein the latch circuit is active on the first logic state of the latch clock signal;

a first precharge transistor having a first terminal coupled to the second voltage supply terminal, a second terminal coupled to the first complementary latch output, and a control terminal coupled to the latch clock input;

a second precharge transistor having a first terminal coupled to the second voltage supply terminal, a second terminal coupled to the second complementary latch output, and a control terminal coupled to the latch clock input;

wherein the first and second precharge transistors are active on the second logic states of the latch clock signal;

a first boost current source coupled to the first current path and having a control terminal coupled to the boost clock input;

a second boost current source coupled to the second current path and having a control terminal coupled to the boost clock input; and wherein the first and second boost current sources are active on only one of the first and second logic states of the boost clock signal.

17. The precharged latch of claim 16 wherein the latch circuit further comprises:

a differential amplifier having first and second differential control terminals coupled to the latch input, which control current through said first and second current paths;

a switched current source coupled between the differential amplifier and the first voltage supply terminal and having a control terminal coupled to the latch clock input; and a pair of cross coupled inverters coupled between the second voltage supply terminal and the differential amplifier and forming the first and second complementary latch outputs.

* * * * *

UNITED STATES PATENT AND TRADEMARK OFFICE
CERTIFICATE OF CORRECTION

PATENT NO. : 5,748,020
DATED : May 5, 1998
INVENTOR(S) : Mactaggart et al.

It is certified that error appears in the above-identified patent and that said Letters Patent is hereby corrected as shown below:

The title page should be deleted to appear as per attached title page.

Please delete drawing sheets 1-2 and substitute drawing sheets 1-2 as per attached.

Signed and Sealed this

Sixteenth Day of February, 1999

Attest:

Attesting Officer

*Acting Commissioner of Patents and Trademarks*

United States Patent [19]

Mactaggart et al.

[11] Patent Number: 5,748,020
[45] Date of Patent: May 5, 1998

[54] HIGH SPEED CAPTURE LATCH

[75] Inventors: Iain Ross Mactaggart, Eden Prairie; James R. Welch, Maple Grove, both of Minn.; Alan Fiedler, Palo Alto, Calif.

[73] Assignee: LSI Logic Corporation, Milpitas, Calif.

[21] Appl. No.: 595,821

[22] Filed: Feb. 2, 1996

[51] Int. Cl.⁶ .................................. H03K 19/096
[52] U.S. Cl. .................. 327/218; 327/208; 327/211; 327/215; 327/55; 327/52; 327/57
[58] Field of Search ............................ 327/199–203, 327/208–215, 218, 219, 223, 51, 52, 54, 55, 57; 365/205, 207, 189.05

[56] References Cited

U.S. PATENT DOCUMENTS

| | | | |
|---|---|---|---|
| 4,712,224 | 12/1987 | Nelson | 377/43 |
| 4,821,296 | 4/1989 | Cordell | 375/119 |
| 4,973,864 | 11/1990 | Nogami | 327/208 |
| 5,081,655 | 1/1992 | Long | 375/119 |
| 5,115,455 | 5/1992 | Samaras et al. | 375/106 |
| 5,148,061 | 9/1992 | Hsueh et al. | 327/211 |
| 5,162,746 | 11/1992 | Ghoshal | 328/155 |
| 5,200,980 | 4/1993 | Briddell | 375/83 |
| 5,272,395 | 12/1993 | Vincelette | 307/355 |
| 5,278,873 | 1/1994 | Lowrey et al. | 375/118 |
| 5,280,205 | 1/1994 | Green et al. | 307/530 |
| 5,301,196 | 4/1994 | Ewen et al. | 370/105.2 |
| 5,361,229 | 11/1994 | Chiang et al. | 365/189.05 |
| 5,371,766 | 12/1994 | Gersbach et al. | 375/119 |
| 5,400,370 | 3/1995 | Guo | 375/118 |
| 5,508,643 | 4/1996 | Khieu | 327/52 |
| 5,508,644 | 4/1996 | Branson et al. | 327/51 |

OTHER PUBLICATIONS

"A 30 MHz High Speed Analog/Digital PLL in 2 μm CMOS," B. Kim et al., IEEE International Solid–State Circuits Convention, Digest of Technical Papers, pp. 104–105 (1990).

"Single Chip 1062 Mbaud CMOS Transceiver for Serial Data Communication," J. Ewen et al., IEEE International Solid–State Circuits Conference, Digest of Technical Papers, pp. 18–19, 32–33, 336, 440 (1995).

Primary Examiner—Timothy P. Callahan
Assistant Examiner—T. T. Lam
Attorney, Agent, or Firm—Westman, Champlin & Kelly, P.A.

[57] ABSTRACT

A high speed capture latch includes differential data inputs, a latch clock input, a boost clock input, a current steering circuit, a switched current source, a latch element and first and second boost current sources. The current steering circuit has first and second differential control terminals which are coupled to the differential data inputs and control current through first and second current paths, respectively. The switched current source is coupled between the current steering circuit and a first voltage supply terminal and has a control terminal coupled to the latch clock input. The latch element is coupled between a second voltage supply terminal and the current steering circuit and provides a latch output. The first boost current source is coupled to the first current path between the latch element and the current steering circuit and has a control terminal coupled to the boost clock input. The second boost current source is coupled to the second current path between the latch element and the current steering circuit and has a control terminal coupled to the boost clock input.

17 Claims, 2 Drawing Sheets